US008692742B2

(12) United States Patent
Tsai et al.

(10) Patent No.: US 8,692,742 B2
(45) Date of Patent: Apr. 8, 2014

(54) PIXEL DRIVING CIRCUIT WITH MULTIPLE CURRENT PATHS IN A LIGHT EMITTING DISPLAY PANEL

(75) Inventors: Tsung-Ting Tsai, Hsinchu (TW); Lee-Hsun Chang, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 747 days.

(21) Appl. No.: 12/584,221

(22) Filed: Sep. 1, 2009

(65) Prior Publication Data

US 2011/0050550 A1    Mar. 3, 2011

(51) Int. Cl.
*G09G 3/30*    (2006.01)
(52) U.S. Cl.
USPC .............................. 345/76; 345/77; 315/169.1
(58) Field of Classification Search
USPC .................................. 345/76, 77; 315/169.1
See application file for complete search history.

(56) References Cited

U.S. PATENT DOCUMENTS

| 6,522,079 | B1  |   | 2/2003  | Yamada ........................ 313/483 |
| 6,864,637 | B2  | * | 3/2005  | Park et al. .................. 315/169.1 |
| 7,195,949 | B2  |   | 3/2007  | Winters |
| 7,250,728 | B2  | * | 7/2007  | Chen et al. .................. 315/169.1 |
| 7,327,357 | B2  |   | 2/2008  | Jeong ............................ 345/204 |
| 7,528,810 | B2  |   | 5/2009  | Ohshima et al. ................ 345/77 |
| 2001/0043168 | A1 |   | 11/2001 | Koyama et al. .................. 345/52 |
| 2004/0004443 | A1 |   | 1/2004  | Park et al. .................. 315/169.1 |
| 2004/0227707 | A1 |   | 11/2004 | Inukai ............................. 345/76 |
| 2005/0030268 | A1 |   | 2/2005  | Zhang et al. ..................... 345/83 |
| 2006/0061525 | A1 | * | 3/2006  | Kim et al. ........................ 345/76 |
| 2006/0255725 | A1 | * | 11/2006 | Kim ............................... 313/506 |
| 2007/0008269 | A1 |   | 1/2007  | Kimura ........................... 345/92 |
| 2007/0182671 | A1 | * | 8/2007  | Nathan et al. ................... 345/76 |
| 2009/0102749 | A1 |   | 4/2009  | Kawabe .......................... 345/45 |
| 2009/0166638 | A1 |   | 7/2009  | Honda |

FOREIGN PATENT DOCUMENTS

| CN | 1475983 A | 2/2004 |
| EP | 1193741 A2 | 4/2002 |

OTHER PUBLICATIONS

Chinese Office Action dated Jun. 30, 2011 in the Chinese counterpart of this U.S. Appl. No. 12/584,221 application.
Chinese Office Action dated Dec. 15, 2011 in the Chinese counterpart application 2010101053953.
Taiwan Office Action dated Apr. 23, 2013 (8 pages).
European Patent Office Action dated Sep. 23, 2013 (7 pages).

* cited by examiner

*Primary Examiner* — Kwang-Su Yang

(57) ABSTRACT

A display panel has a plurality of OLED pixels arranged in rows and columns. The pixel driving circuit has two or more current paths through a plurality of switching elements for providing the necessary current to the OLEDs in a pixel. The control end of each switching element is connected to the control end of the other switching elements, but each switching element has a separate power source which can be separately adjustable. In some embodiments, in a pixel or subpixel, one switching element is located at one end and one switching element is located at the other end of a pixel length, and each pixel is adjacent to a first power source line and a second power source line along the pixel length for separately providing the electrical power to two switching elements.

18 Claims, 10 Drawing Sheets

PIXEL DRIVING CIRCUIT WITH MULTIPLE CURRENT PATHS IN A LIGHT EMITTING DISPLAY PANEL

FIELD OF THE INVENTION

The present invention relates generally to a display panel having a plurality of pixels made of light-emitting diodes and, more particularly, to a circuit for driving the pixels.

BACKGROUND OF THE INVENTION

Light-emitting devices, such as organic light-emitting diodes (OLEDs), have been used in an active-matrix OLED (AMOLED) display. An active-matrix OLED (AMOLED) display panel consists of a two dimensional array of OLED pixels deposited or integrated onto a thin-film transistor (TFT) array. A typical OLED display panel is shown in FIG. 1. As shown, the display panel 1 has a plurality of pixels 10 arranged in rows and columns in a display area 100 driven by a data driver 200 and a gate driver 300. The data driver 200 is used to provide signals indicative of data on a data line to each of the columns and a gate driver 300 is used to provide a gate line signal to each of the rows. In a color OLED display panel, an image is generally presented in three colors: red (R), green (G) and blue (B). Each of the pixels 10 is typically divided into three color sub-pixels: red sub-pixel 20R, green sub-pixel 20G and blue sub-pixel 20B, as shown in FIG. 2. A data line 221 is used to provide the data signal to the R sub-pixel in a column, a data line 222 is used to provide the data signal to the G sub-pixel in the same pixel column, and a data line 223 is used to provide the data signal to the B sub-pixel in the same pixel column. The data line 224 is used to provide the data signal to the R sub-pixel in the next pixel column. A gate line 231 is used to provide the gate line signal to all sub-pixels in a row and a gate line 232 is used to provide the gate line signal to all sub-pixels in the next row.

SUMMARY OF THE INVENTION

The present invention provides a method and a pixel driving circuit in which two or more current paths through a plurality of switching elements are used to provide the necessary current to one or more OLEDs in a pixel. In particular, the control end of each switching element is connected to the control end of the other switching elements. According to the present invention, the gate terminal of one switching element is connected to the gate terminal of another switching element, whereas each switching element is connected to a different power source line. According to various embodiments of the present invention, the different source lines are separately connected to different power sources so that the current in each current path can be separately adjustable.

Thus, the first aspect of the present invention is a light-emitting display panel. The display panel comprises:
a plurality of pixels arranged in a plurality of rows and columns;
a plurality of data lines, each data line arranged to provide data signals to the pixels in a column;
a plurality of gate lines, each gate line arranged to provide scan signals to the pixels in a row, wherein each pixel comprises:
a control switching element having a first switching end arranged to receive data signals from a data line, a second switching end, and a control end arranged to receive a scan signal;
a first switching element comprising:
a first switching terminal arranged to receive electrical power for providing a first current in a first current path; a second switching terminal connected to a light-emitting component; and a control terminal connected to the second switching end of the control switching element; and
a second switching element comprising: a first switching terminal arranged to receive electrical power for providing a second current in a second current path; a second switching terminal connected to the light-emitting component; and a control terminal connected to the second switching end of the control switching element.

According to some embodiments, the light-emitting component comprises: a first light-emitting diode arranged to receive the first current from the first current path; and a second light-emitting diode arranged to receive the second current from the second current path.

According to various embodiments of the present invention, each pixel comprises:
a first capacitor connected between the first switching terminal and the control terminal of the first switching element, and a second capacitor connected between the switching terminal and the control terminal of the second switching element.

The first switching element is arranged to receive electrical power from a first power source and the second switching element is arranged to receive electrical power from a different second power source.

According to one embodiment of the present invention, each pixel comprises a pixel length, wherein the first switching element and the first light-emitting diode are located at a first end of the pixel length, and the second switching element and the second light-emitting diode are located at a second end of the pixel length. Each pixel is adjacent to a first power source line and a second power line along the pixel length, the first switching element arranged to receive electrical power from a first power source line and the second switching element arranged to receive electrical power from a second power source line.

The second aspect of the present invention is a method for use in a light-emitting display panel, the light-emitting display panel comprising:
a plurality of pixels arranged in a plurality of rows and columns;
a plurality of data lines, each data line arranged to provide data signals to the pixels in a column;
a plurality of gate lines, each gate line arranged to provide scan signals to the pixels in a row, wherein each pixel comprises a light-emitting component, wherein each of the pixels comprises a control switching element having a first switching end arranged to receive data signals from a data line, a second switching end, and a control end arranged to receive a scan signal, and each of the pixels comprises a light emitting component, said method comprising:
disposing a first current path in said each of the pixels for providing a first current to the light emitting component, and
disposing a different second current path in said each of the pixels for providing a second current to the light emitting component,
controlling the first current in the first current path through a first switching element, and
controlling the second current in the second current path through a second switching element, the first switching element comprising:
a first switching terminal arranged to receive electrical power for providing the first current in the first current path, a second switching terminal connected to the light-emitting component, and a control terminal connected to the second switching end of the control switching element; and the second switching element comprising: a first switching terminal arranged to receive electrical power for providing the second current in the second current path, a second switching terminal connected to the light-emitting component, and a control terminal connected to the second switching end of the control switching element.

According to various embodiments of the present invention, the light-emitting component comprises: a first light-emitting diode arranged to receive the first current from the first current path; and a second light-emitting diode arranged to receive the second current from the second current path. Each pixel comprises a pixel length, wherein the first switching element and the first light-emitting diode are located at a first end of the pixel length, and the second switching element and the second light-emitting diode are located at a second end of the pixel length.

The present invention will become apparent upon reading the description taken in conjunction with FIGS. 3 to 11.

BRIEF DESCRIPTION OF THE INVENTION

DETAILED DESCRIPTION OF THE INVENTION

In a typical OLED display panel, a power source is used to provide a voltage to a plurality of pixels. A conductor is used to provide the voltage to each of the pixels as a drain voltage applied to a TFT which regulates the current through a connecting OLED. The conductor inherently has a resistance, causing a drop in the voltage in proportion to the current. The voltage drop can be substantial if the current is high. As a result, the brightness of the display may vary noticeably among the pixels, affecting the viewing quality of an OLED display panel.

Figure 1:
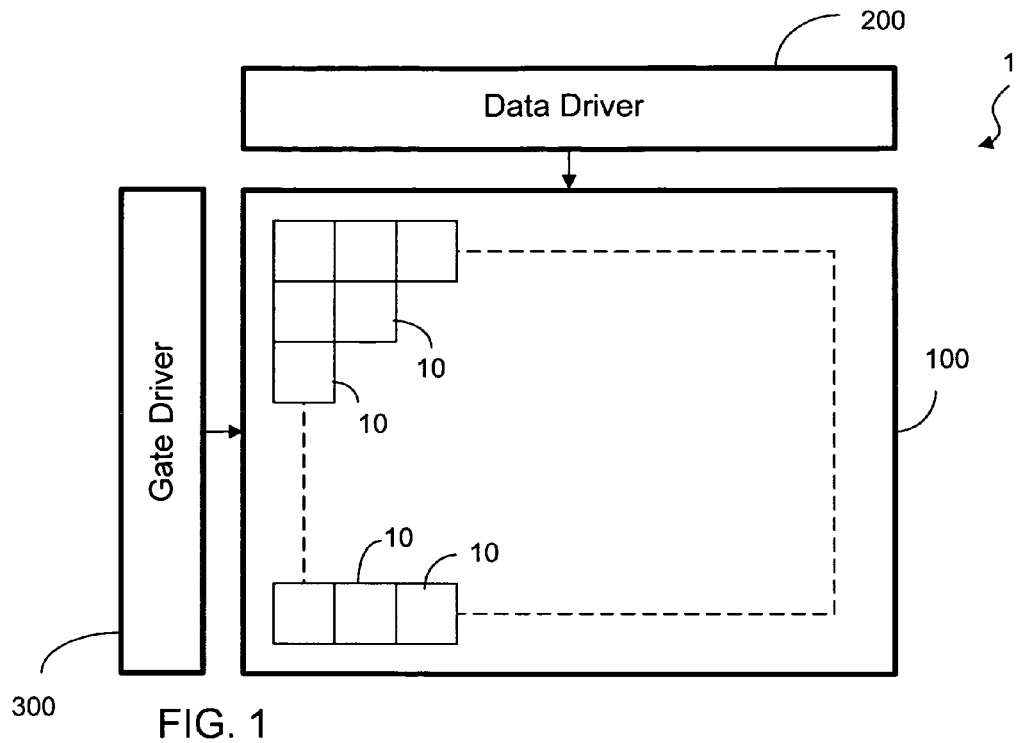
FIG. 1 shows a typical OLED display panel.
Figure 2:
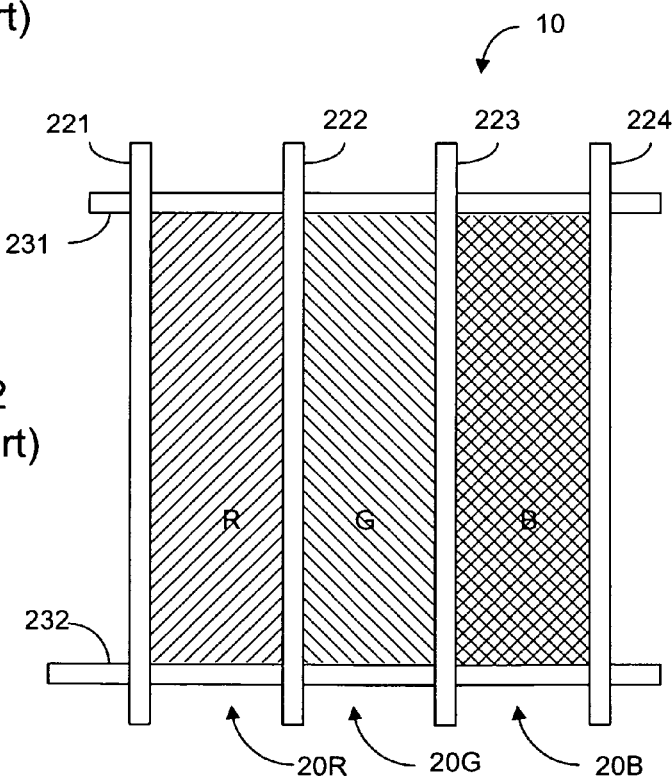
FIG. 2 shows three color sub-pixels in a pixel in a typical OLED display panel.
Figure 3:
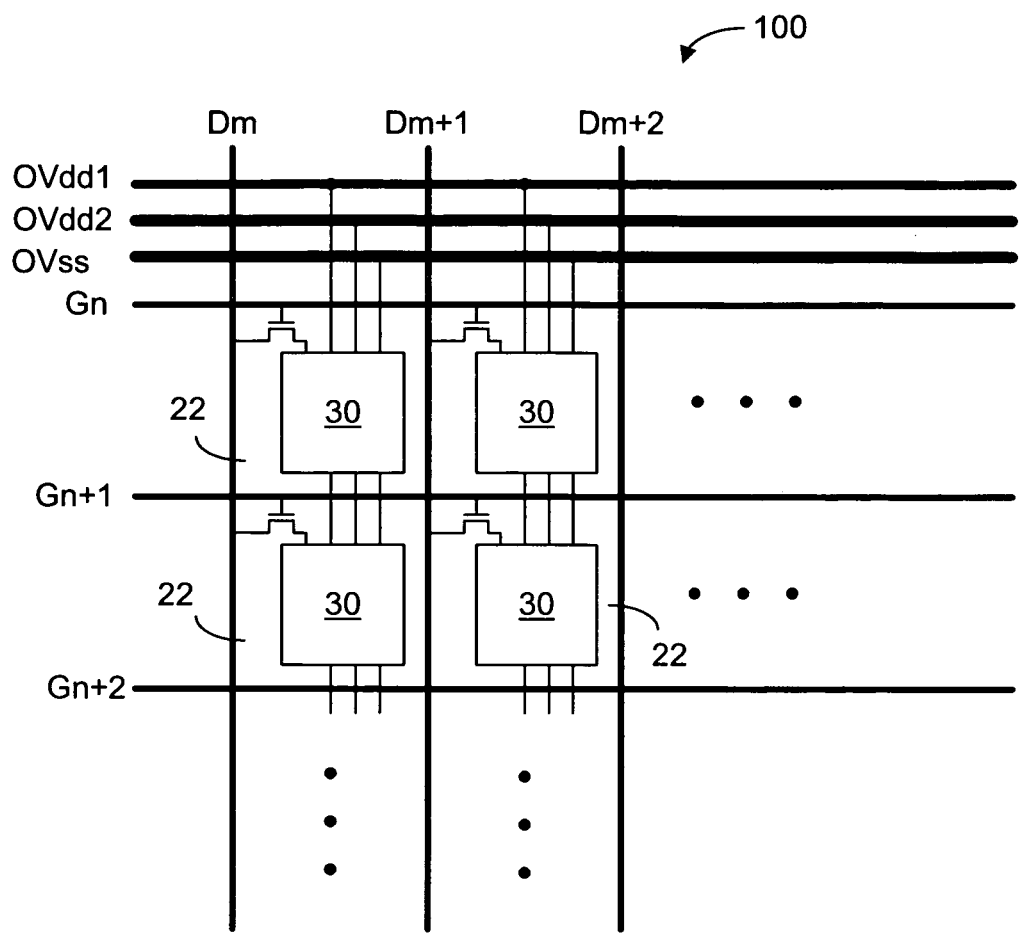
FIG. 3 shows a portion of the display area having a plurality of pixels, according to various embodiments of the present invention.

The present invention provides a pixel driving circuit and a method for improving the viewing quality of the OLED display panel by reducing the voltage drop in the pixels. According to various embodiments of the present invention, the drain voltage applied to the switching elements in the OLED pixels comprises two or more separate lines OVdd1, OVdd2. If the source voltage line in each pixel is short, it is sufficient to use only one source voltage line OVss. For example, if the OLED is fabricated on a substrate where one end of the diode is in direct contact with an electrically conducting plane, the voltage drop on the OVss side is negligible. However, it is also possible to use two or more OVss lines. As shown in FIG. 3, each pixel 22 has a pixel area 30 and each pixel area 30 has two separate conductors connected to OVdd1 and OVdd2. Gn, Gn+1, . . . are gate lines for providing gate line data and Dm, Dm+1, . . . are data lines for providing data signal.

In one embodiment of the present invention, a pixel area 30 comprises two OLEDs, D1 and D2, separately connected to two TFTs, M1 and M2 to form two separate current paths (shown with current I1 and current I2). The gate terminals of M1 and M2 are connected together such that, in effect, the current paths are connected in parallel. Both M1 and M2 are p-type TFTs arranged to be switched on or off simultaneously by a switching element M3, which can be a TFT. One end of the TFT M3 is connected to a data line to receive a signal Vdata m and the gate terminal of M3 is connected to a gate line to receive a scan signal n. Each of the current I1 and current I2 has a storage capacitor C1, C2 connected to the switching element M3.

With two or more OLEDs in each OLED pixel, it is possible to reduce the current I1 and current I2 to achieve the brightness from one OLED with a higher current. As a result, the voltage drop in each of the current paths is smaller than the voltage drop if only one current path is used to produce light. For example, the current used in only one current path to produce light at a certain brightness level is I, then it is possible to use I1<I and I2<I to achieve the same brightness level. If the brightness of an OLED is proportional to the current, then I=I1+I2.

Figure 5:
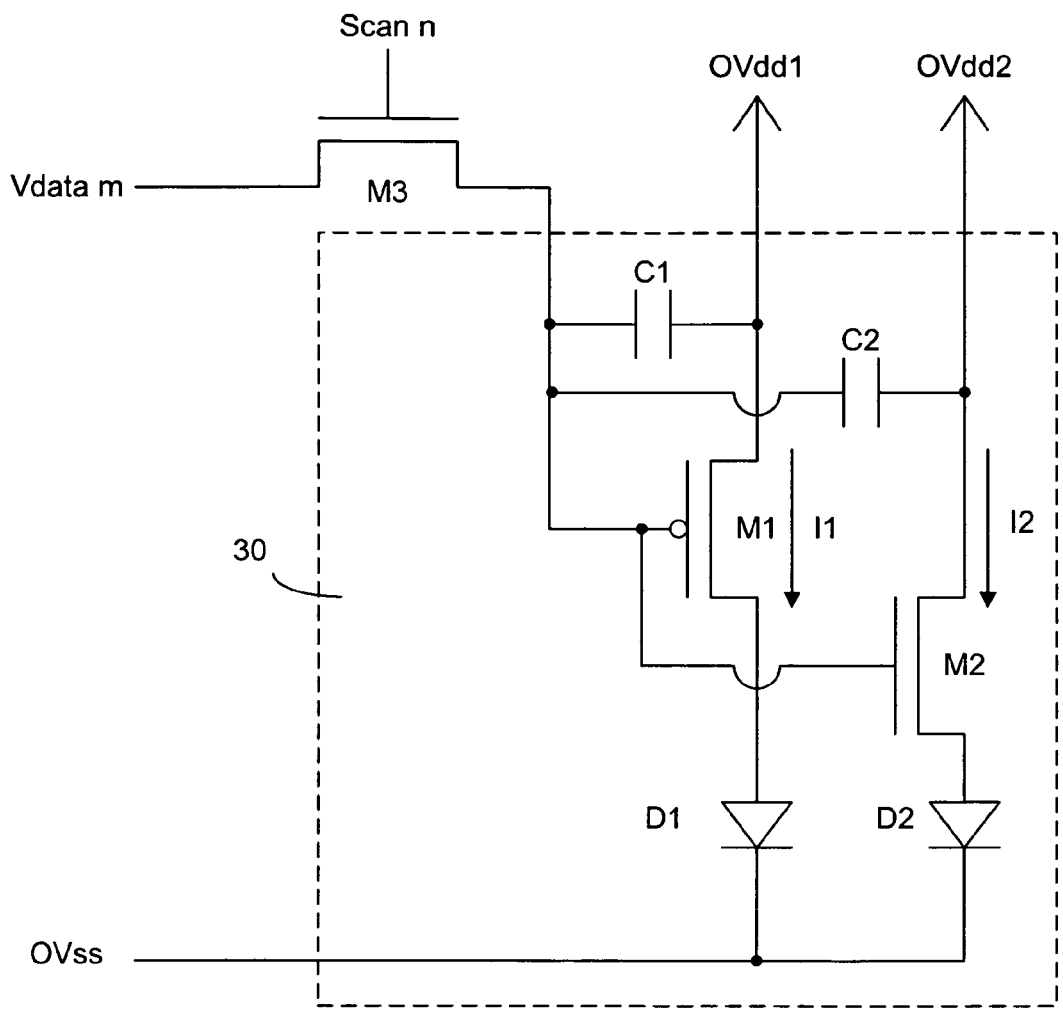
FIG. 5 shows a pixel and its driving circuit, according to another embodiment of the present invention.

In another embodiment of the present invention, one of the current regulating TFTs is a p-type TFT and the other is an n-type TFT as shown in FIG. 5.

In yet another embodiment of the present invention, both M1 and M2 are n-type TFTs.

Figure 4:
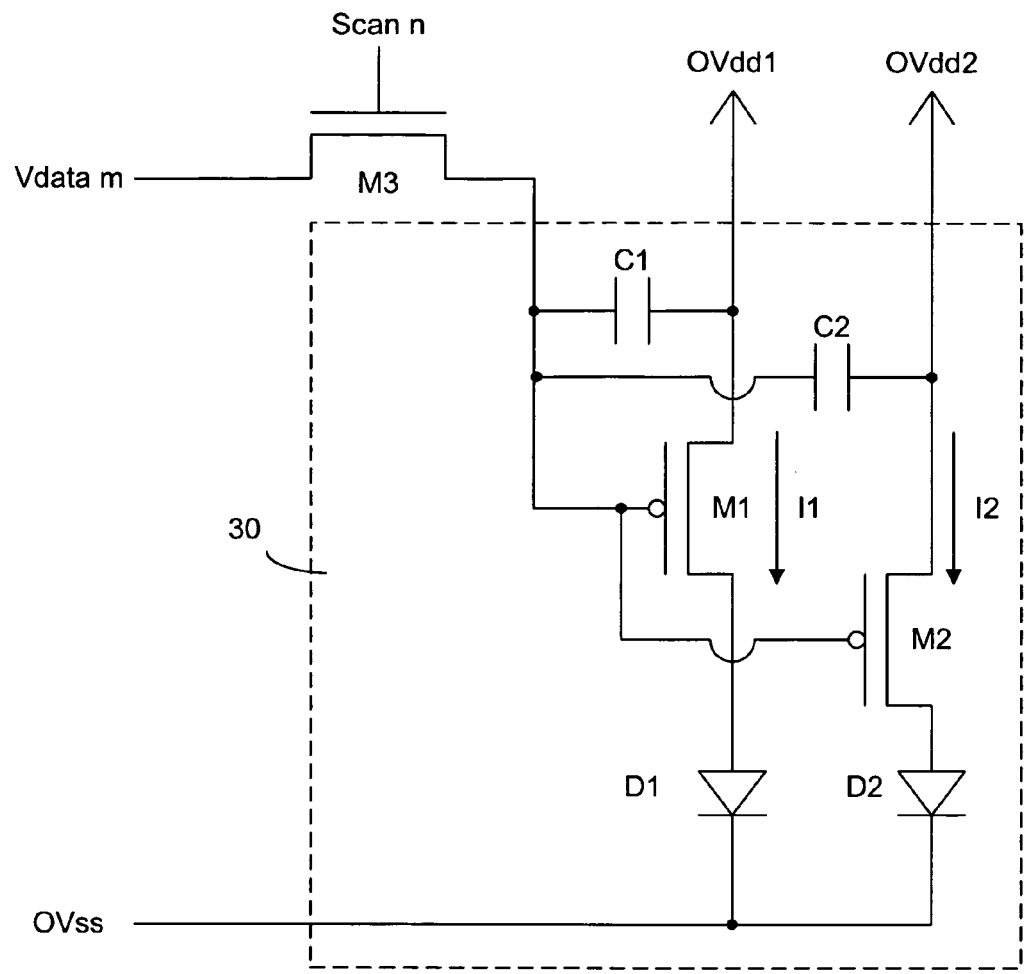
FIG. 4 shows a pixel and its driving circuit, according to one embodiment of the present invention.
Figure 6:
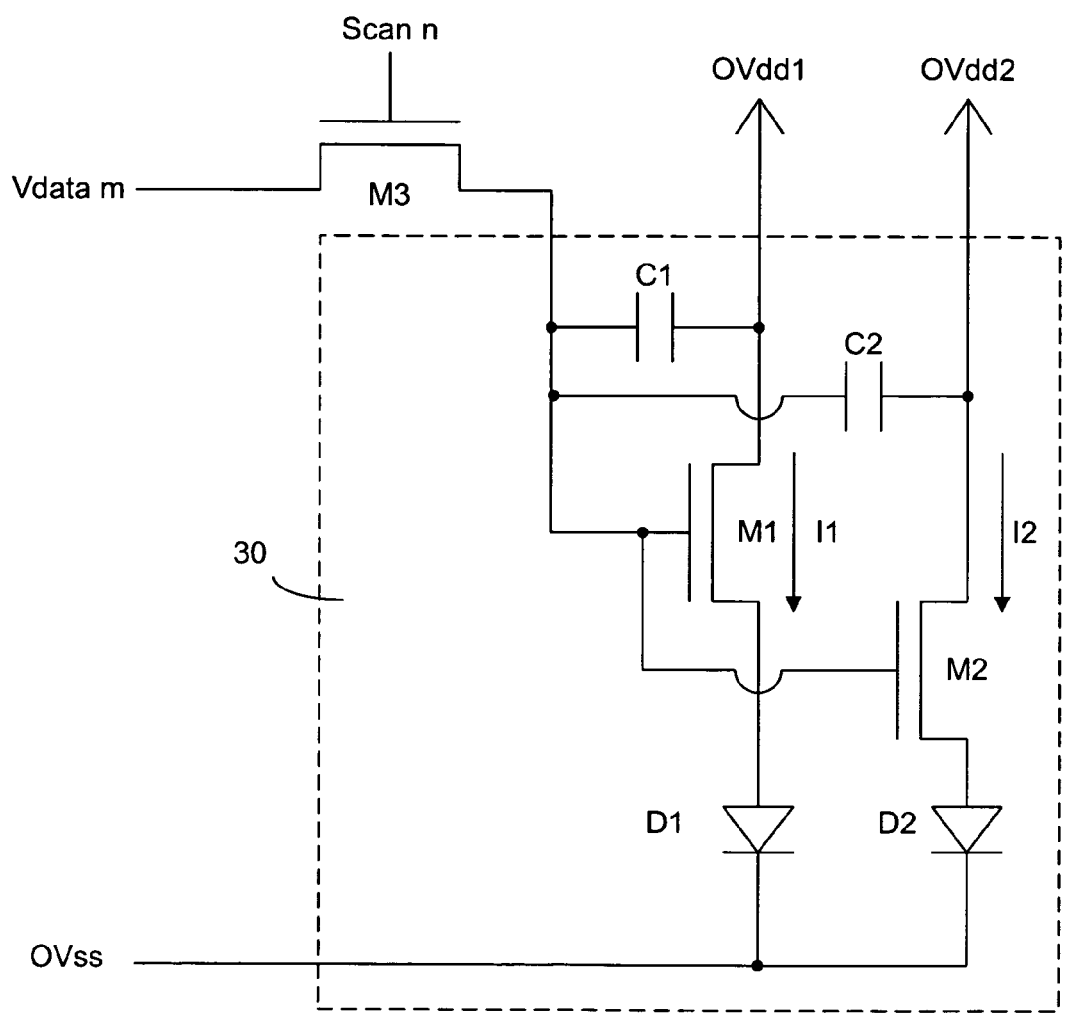
FIG. 6 shows a pixel and its driving circuit, according to yet another embodiment of the present invention.

In the embodiments as shown in FIGS. 4 to 6, it is possible to put the anodes of both M1 and M2 in contact with an electrically conducting layer on a substrate where OVss is provided. As such, the voltage drop on the OVss side is substantially eliminated.

Figure 7:
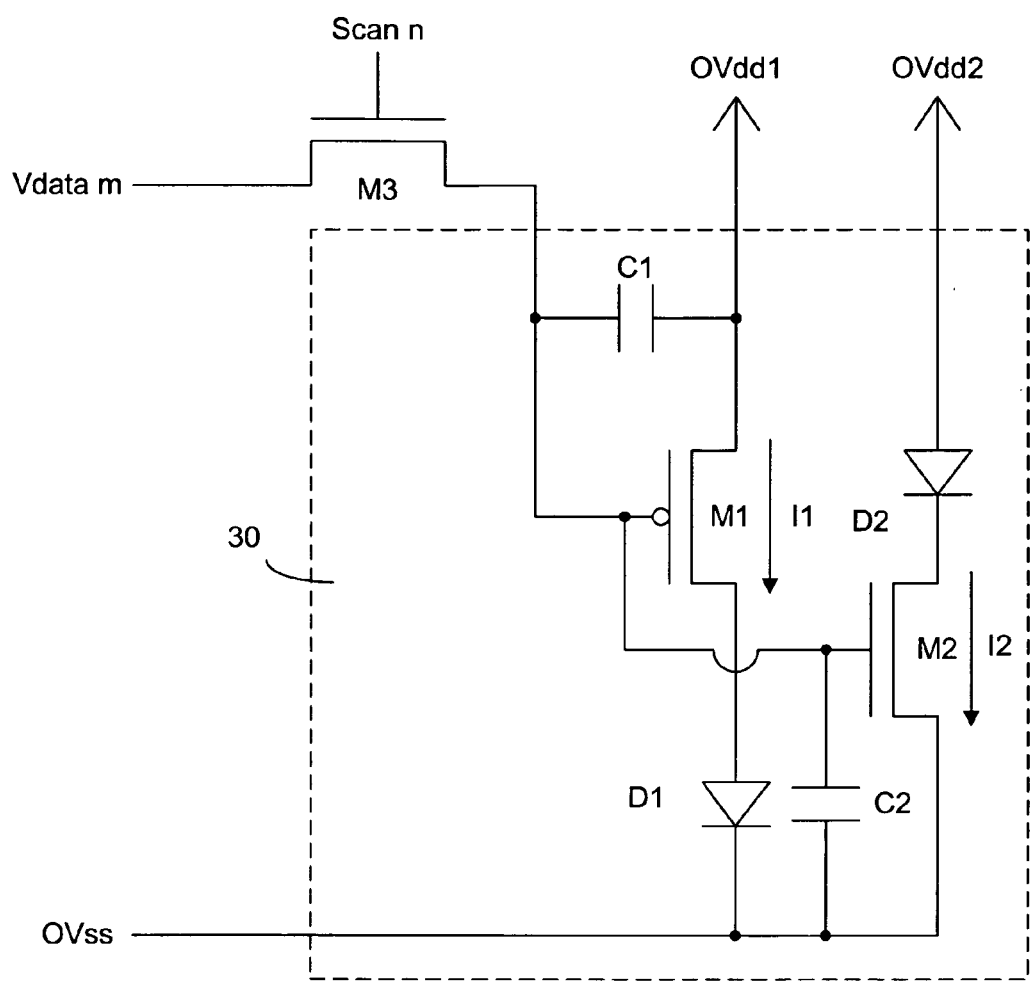
FIG. 7 shows a pixel and its driving circuit, according to still another embodiment of the present invention.
Figure 8:
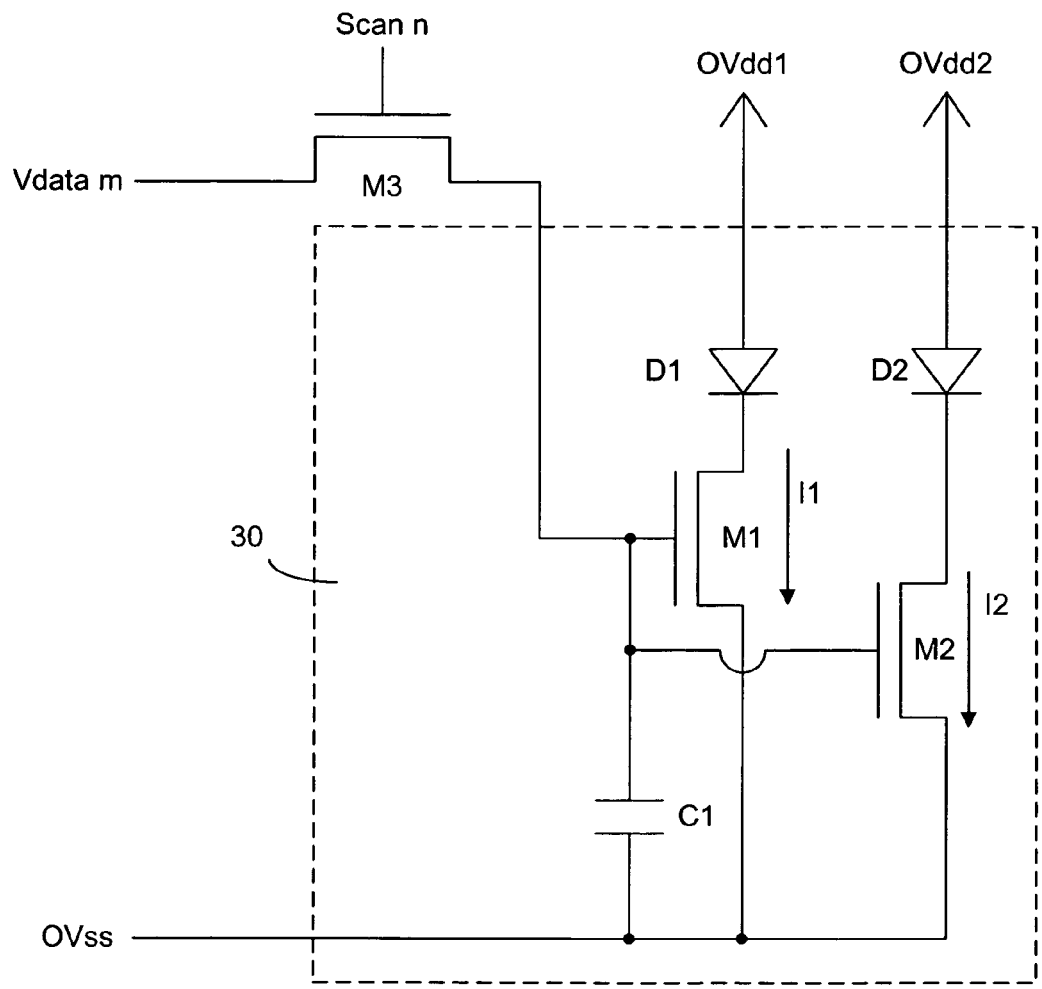
FIG. 8 shows a pixel and its driving circuit, according to a different embodiment of the present invention.

In a current path wherein an n-type TFT is used to regulate the current through the OLED, it is also possible to connect one switching end of the TFT to OVss, as shown in FIGS. 7 and 8. In this configuration, it would be advantageous to keep the connector between the source terminal of the TFT or TFTs to the OVss source very short so as to reduce the voltage drop on the OVss side.

Figure 9:
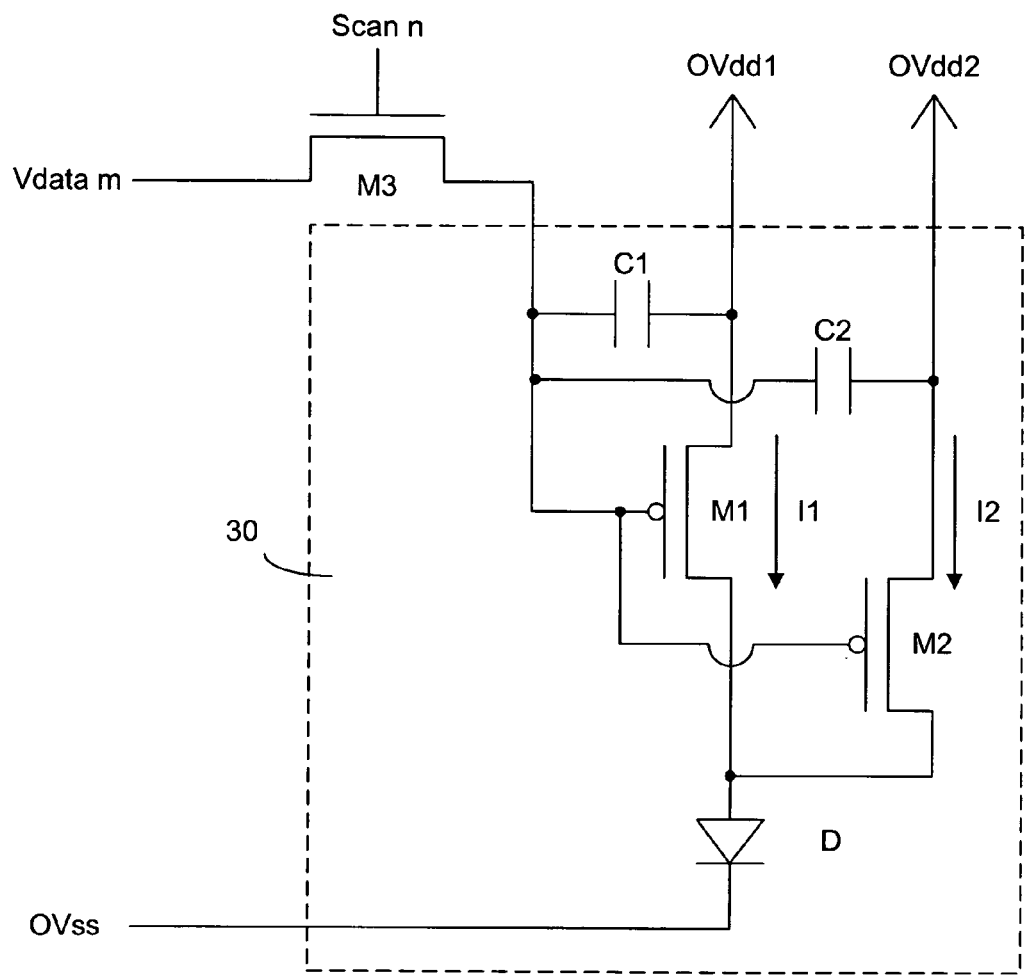
FIG. 9 shows a pixel and its driving circuit, according to yet another embodiment of the present invention.

It should be noted that, according to various embodiments of the present invention, the voltage drop on OVdd can be reduced by using two or more current paths to provide the current to an OLED on each of the current paths. It is possible to achieve a similar voltage-drop reduction by passing the currents from two or more current paths to one OLED, as shown in FIG. 9.

Figure 10:
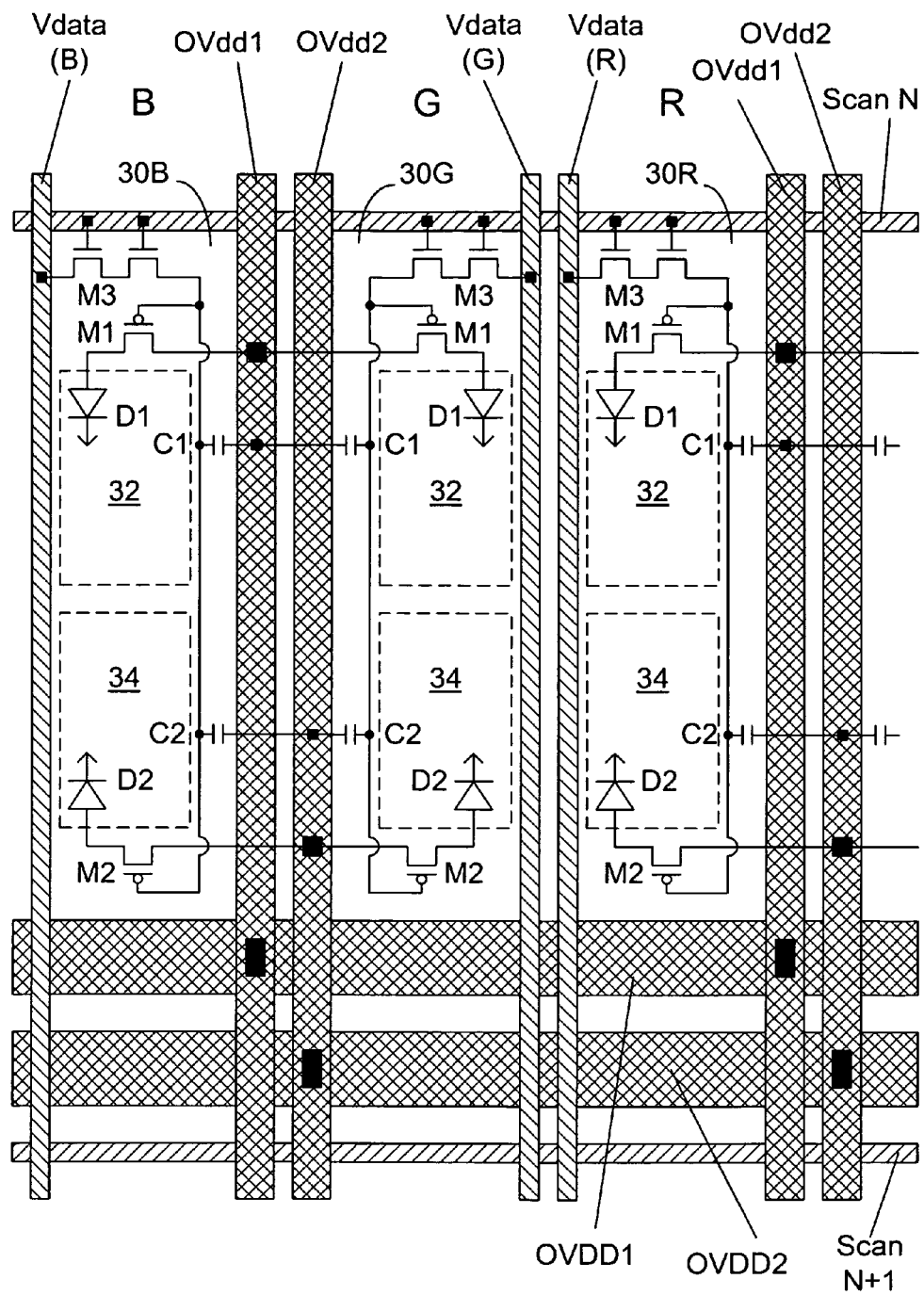
FIG. 10 shows an exemplary layout of a pixel, according to the present invention.

In summary, the present invention provides a method and a pixel driving circuit in which two or more current paths, through a plurality of switching elements, are used to provide the necessary current to one or more OLEDs in a pixel. In particular, the control end of each switching element is connected to the control end of the other switching elements. For example, as shown in FIGS. 4 to 6, the gate terminal of TFT M1 is connected to the gate terminal of TFT M2. According to various embodiments of the present invention, each switching element has a separate power source OVdd so that the power sources can be separately adjustable. Furthermore, with separate power sources, it is possible to arrange OVdd1 and OVdd2 to be provided from different directions. For example, each of the pixels 30 as shown in FIG. 4 represents a color sub-pixel R, B or G. The color sub-pixels can be arranged side-by-side, with two power-source lines OVdd1, OVdd2 located between two adjacent color sub-pixels such as B and G. In each of the sub-pixels R, B and G, the TFT M1 is located at one end of the sub-pixel and the other TFT M2 is located at the other end. As shown in FIG. 10, the sub-pixel 30 has a width separated by a data line (Vdata) and one of power-source lines OVdd1 and OVdd2, and a length separated by a scan line and a source-supply line OVDD. Along the length the sub-pixel has a first end and a second end. The first end has a first OLED area 32 and the second end has a second OLED area 34. At the first end, TFT M1 is used to provide the current path to OLED D1 in the first OLED area 32. At the second end, TFT M2 is used to provide the current path to OLED D2 in the second OLED area 34. As such, the power-source line OVdd1 provides a source voltage to TFT M1 from the first end and the power-source line OVdd2 provides a source voltage to TFT M2 from the second end. Since each TFT is connected to a separate power-source line at a short distance, the voltage drop of OVdd1 and OVdd2 can be reduced.

Figure 11:
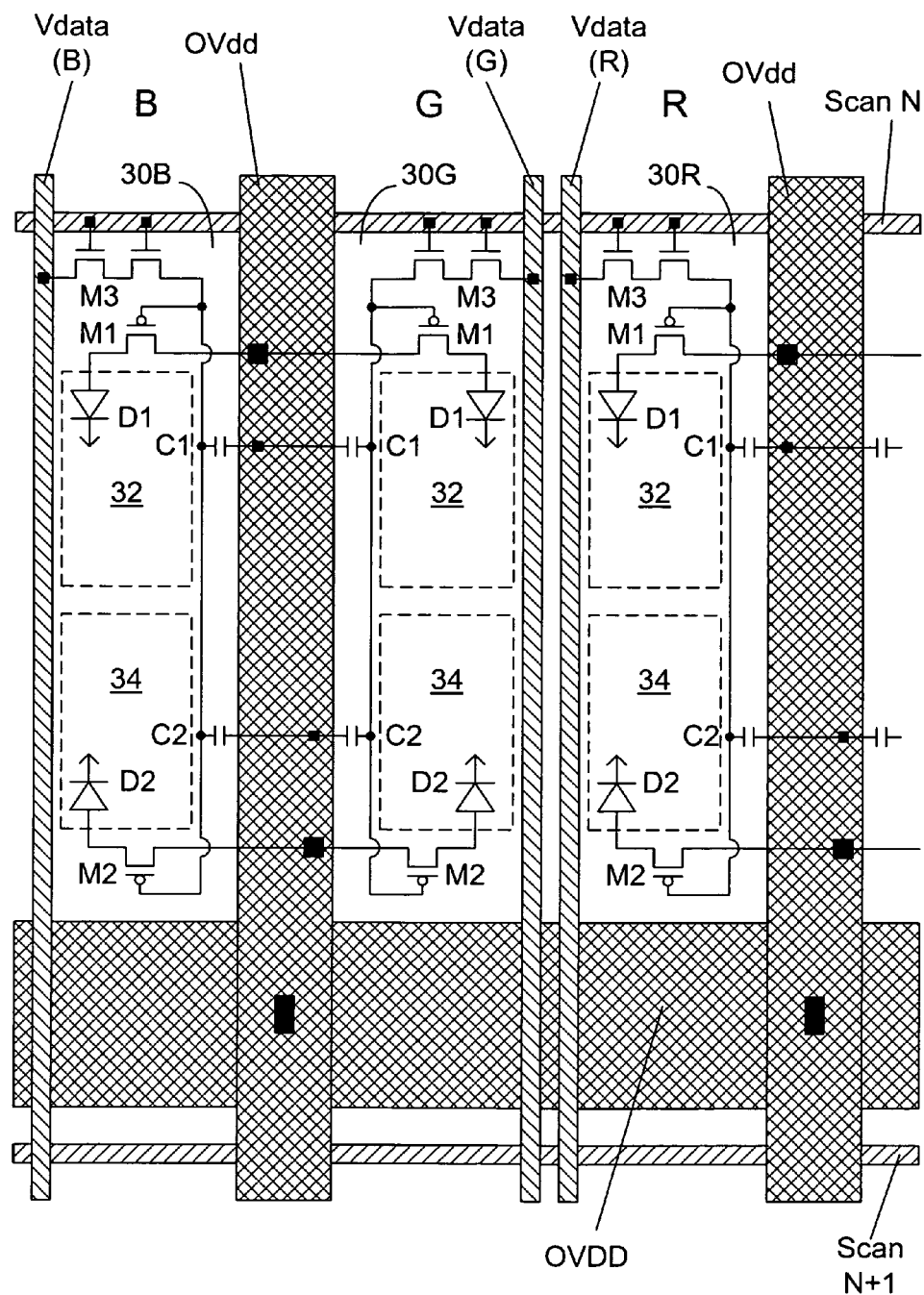
FIG. 11 shows another layout of a pixel, according to the present invention.

In other embodiments, the power sources that provide electrical power to M1 and M2 are connected to the same power source OVDD, as shown in FIG. 11. Thus, the power source lines OVdd1 and OVd2 as shown in FIG. 10 can be combined into a power source line OVdd.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:
1. A light-emitting display panel having a display side, comprising:
   a plurality of pixels arranged in a plurality of rows and columns on the display side;
   a plurality of data lines, each data line arranged to provide a data signal to the pixels in a column;
   a plurality of gate lines, each gate line arranged to provide a scan signal to the pixels in a row, wherein each pixel comprises:
   a first light-emitting area and a second light-emitting area different from the first light-emitting area;
   a control switching element having a first switching end arranged to receive the data signal from a data line, a second switching end, and a control end arranged to receive the scan signal;
   a first switching element comprising:
      a first switching terminal arranged to receive electrical power for providing a first current in a first current path;
      a second switching terminal connected to a first light-emitting diode; and
      a control terminal connected to the second switching end of the control switching element; and
   a second switching element comprising:
      a first switching terminal arranged to receive electrical power for providing a second current in a second current path;
      a second switching terminal connected to a second light-emitting diode; and
      a control terminal connected to the second switching end of the control switching element,
   wherein the first light-emitting diode is arranged to receive the first current from the first current path for emitting light in the first light-emitting area,
   wherein the second light-emitting diode is arranged to receive the second current from the second current path for emitting light in the second light-emitting area, and
   wherein the first light-emitting area and the second light-emitting area are located between the first switching element and the second switching element.

2. The light-emitting display panel of claim 1, wherein each of the first switching element and the second switching element comprises a p-type transistor.

3. The light-emitting display panel of claim 1, wherein each of the first switching element and the second switching element comprises an n-type transistor.

4. The light-emitting display panel of claim 1, wherein the first switching element comprises a p-type transistor and the second switching element comprises an n-type transistor.

5. The light-emitting display panel of claim 1, wherein said each pixel further comprises:
   a capacitor connected between the first switching terminal and the control terminal of the first switching element.

6. The light-emitting display panel of claim 1, wherein the first switching element is arranged to receive electrical power from a first power source and the second switching element is arranged to receive electrical power from a second power source different from the first power source simultaneously.

7. The light-emitting display panel of claim 6, wherein the first power source is configured to provide a first voltage and the second power source is configured to provide a second voltage simultaneously with the first voltage.

8. The light-emitting display panel of claim 1, wherein said each pixel comprises a pixel length, and wherein the first switching element and the first light-emitting diode are located at a first end of the pixel length, and the second switching element and the second light-emitting diode are located at a second end of the pixel length.

9. The light-emitting display panel of claim 8, wherein said each pixel is adjacent to a first power source line and a second power source line along the pixel length, the first switching element arranged to receive electrical power from the first power source line and the second switching element arranged to receive electrical power from the second power source line.

10. The light-emitting display panel of claim 1, wherein said each pixel comprises a color sub-pixel.

11. The light-emitting display panel of claim 1, wherein the first current and the second current are simultaneously provided in response to the scan signal, and the first light-emitting diode is configured to produce light in response to the first current and the second light-emitting diode is configured to produce light in response to the second current.

12. The light-emitting display panel of claim 1, wherein the first light-emitting area is located adjacent to the second light-emitting area in a non-overlapping manner.

13. The light-emitting display panel of claim 1, wherein the first light-emitting diode and the second light-emitting diode are arranged to emitting light substantially the same direction for illuminating said each pixel.

14. A method for use in a light-emitting display panel having a display side, the light-emitting display panel comprising:
   a plurality of pixels arranged in a plurality of rows and columns on the display side;
   a plurality of data lines, each data line arranged to provide a data signal to the pixels in a column;
   a plurality of gate lines, each gate line arranged to provide a scan signal to the pixels in a row, wherein each of the pixels comprises a control switching element having a first switching end arranged to receive the data signal from a data line, a second switching end, and a control end arranged to receive the scan signal, and said each of the pixels comprises a first light-emitting area and a second light-emitting area different from the first light-emitting area, said method comprising:

disposing a first current path in said each of the pixels for providing a first current, and disposing a second current path different from the first current path in said each of the pixels for providing a second current, controlling the first current in the first current path through a first switching element, and controlling the second current in the second current path through a second switching element, the first switching element comprising:
- a first switching terminal arranged to receive electrical power for providing the first current in the first current path;
- a second switching terminal connected to the first light-emitting diode; and
- a control terminal connected to the second switching end of the control switching element; and the second switching element comprising:
- a first switching terminal arranged to receive electrical power for providing the second current in the second current path;
- a second switching terminal connected to the second light-emitting diode; and
- a control terminal connected to the second switching end of the control switching element, wherein the first light-emitting diode is arranged to receive the first current from the first current path for emitting light in the first light-emitting area, wherein the second light-emitting diode is arranged to receive the second current from the second current path for emitting light in the second light-emitting area, and wherein the first light-emitting area and the second light-emitting area are located between the first switching element and the second switching element.

15. The method of claim 14, wherein said each pixel comprises a pixel length, and wherein the first switching element and the first light-emitting diode are located at a first end of the pixel length, and the second switching element and the second light-emitting diode are located at a second end of the pixel length.

16. The method of claim 15, further comprising:
arranging a first power source line and a second power line along the pixel length such that said each pixel is adjacent to both the first power source line and the second power source line;

arranging the first switching element for receiving electrical power from the first power source line and the second switching element for receiving electrical power from the second power source line.

17. The method of claim 14, wherein the first current mad the second current are simultaneously provided in response to the scan signal, and the first light-emitting diode is configured to produce light in response to the first current and the second light-emitting diode is configured to produce light in response to the second current.

18. The method of claim 14, wherein the first switching element is arranged to receive electrical power from a first power source and the second switching element is arranged to receive electric power from a second power source different from the power source simultaneously, and wherein the first power source is configured to provide a first voltage and the second power source is configured to provide a second voltage simultaneously with the first voltage.

* * * * *